United States Patent [19]
Lavaud

[11] Patent Number: 5,189,705
[45] Date of Patent: Feb. 23, 1993

[54] AUDIO EQUIPMENT

[75] Inventor: Simon-André Lavaud, Villingen-Schwenningen, Fed. Rep. of Germany

[73] Assignee: Deutsche Thomson-Brandt GmbH, Villingen-Schwenningen, Fed. Rep. of Germany

[21] Appl. No.: 804,469

[22] Filed: Dec. 5, 1991

Related U.S. Application Data

[63] Continuation of Ser. No. 571,766, Aug. 23, 1990, abandoned.

[30] Foreign Application Priority Data

Aug. 24, 1989 [DE] Fed. Rep. of Germany ....... 3927902

[51] Int. Cl.⁵ .............................................. H03G 3/00
[52] U.S. Cl. ..................... 381/104; 381/107; 381/108; 381/109
[58] Field of Search ................ 381/104, 107, 108, 109

[56] References Cited

U.S. PATENT DOCUMENTS

| | | | |
|---|---|---|---|
| 4,706,294 | 11/1987 | Ouchida | 381/109 |
| 4,913,025 | 4/1990 | Nakano | 381/109 |
| 4,962,545 | 10/1990 | Klaczak | 381/107 |

Primary Examiner—James L. Dwyer
Assistant Examiner—Jack Chiang
Attorney, Agent, or Firm—Max Fogiel

[57] ABSTRACT

An arrangement for adjusting the volume of a played-back signal by a microprocessor from an audio system, in which the volume is increased incrementally by a pulse generator. The instantaneous level of volume is tested constantly to determine whether it is equal to or higher than an previously-stored threshold. Further increase in volume is inhibited after the threshold has been attained, so that the current volume level is retained independent of actuation of volume controls. By actuating a switch, the volume may be further increased even after the threshold has been exceeded.

4 Claims, 2 Drawing Sheets

AUDIO EQUIPMENT

The present application is a continuation of the parent application Ser. No. 571,766 which is abanded filed Aug. 23, 1990.

BACKGROUND OF THE INVENTION

The invention concerns audio equipment with a system for playing back spoken words and/or music and with a system for adjusting the volume of the played-back signal by way of a microprocessor. Equipment of this type, used to play back acoustic signals, is often so large that, when incorrectly employed, it can either destroy the audio transformer or its volume will be high enough to have a deleterious effect on the environment and even on human health.

SUMMARY OF THE INVENTION

The object of the present invention is accordingly to provide a way of avoiding these problems.

Digital volume adjustment with analog adjustment being undertaken by way of a digital-to-analog converter is known. The invention provides for a memory that stores a value corresponding to a desired volume that the user cannot exceed by manual adjustment. This maximum level can be individually prescribed and adapted to given exterior factors with respect to the associated audio transformer and to physiological stress.

The invention is particularly appropriate for microprocessor-controlled equipment in that it can be programmed into the equipment's software and accordingly entails no additional expense.

BRIEF DESCRIPTION OF THE DRAWINGS

FIG. 1 is a flow chart for a program that is executed by a microprocessor and controls the audio equipment.

DESCRIPTION OF THE PREFERRED EMBODIMENTS

When volume is adjusted by a pulse generator, it is adjusted incrementally. This discontinuous increase in volume is accompanied by constant testing to determine whether an instantaneous level is equal to or higher than a previously stored threshold. Once this threshold is attained, further increase in volume is inhibited and the current level is retained even though the volume controls are activated. Another polling occurs to determine whether the threshold may or may not be exceeded. If "yes," the volume is increased even though the threshold has been attained. It may for example be desirable to exceed the stored level. This, however, can be done only once a special button has been pressed. Thus, such unauthorized persons as children will be able to vary the volume only up to the established threshold, whereas an adult who knows about the button can press it and continue varying the volume.

Figure 1:
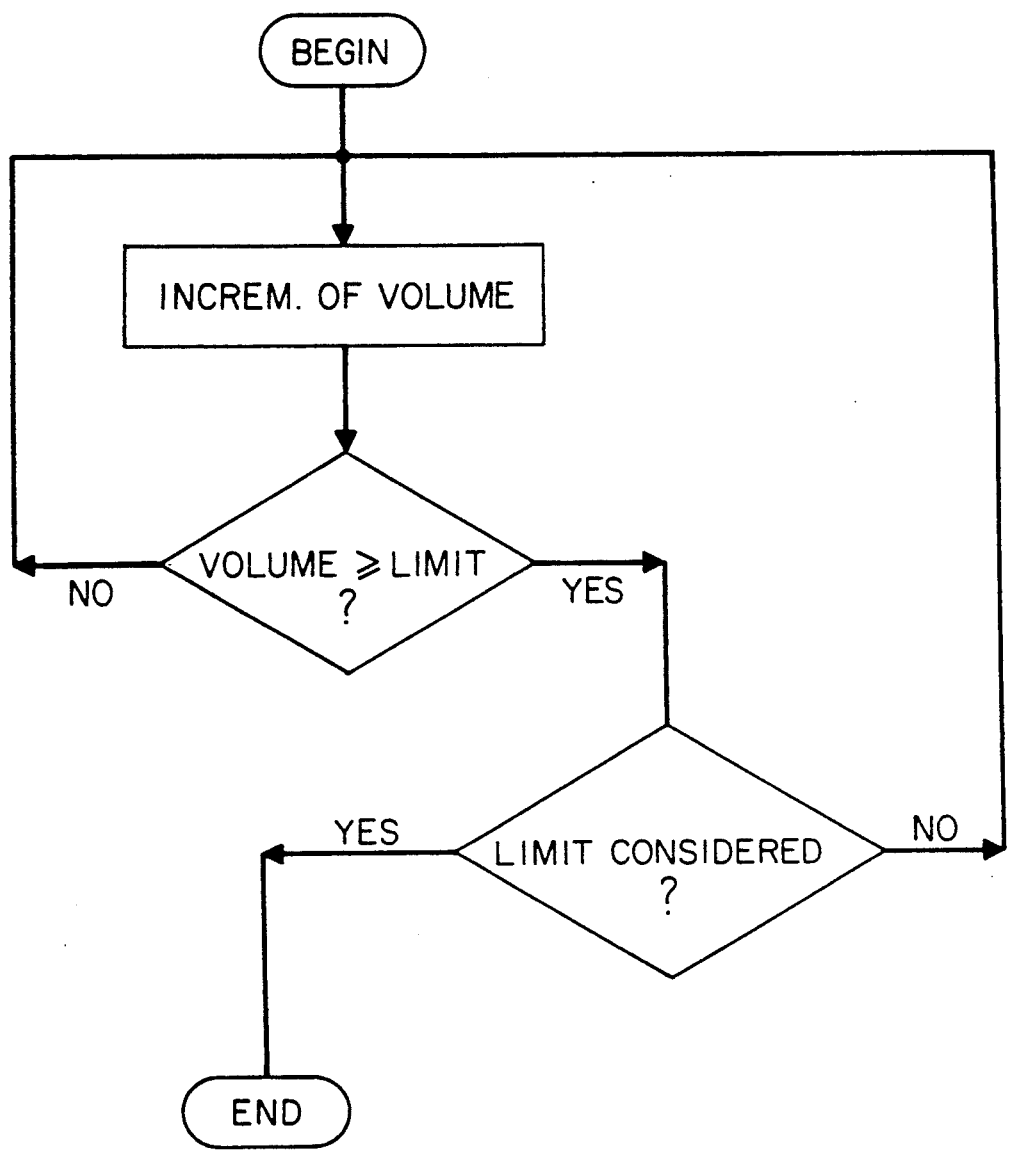
FIG. 1 shows a flow diagram of a program in the apparatus of the present invention.
Figure 2:
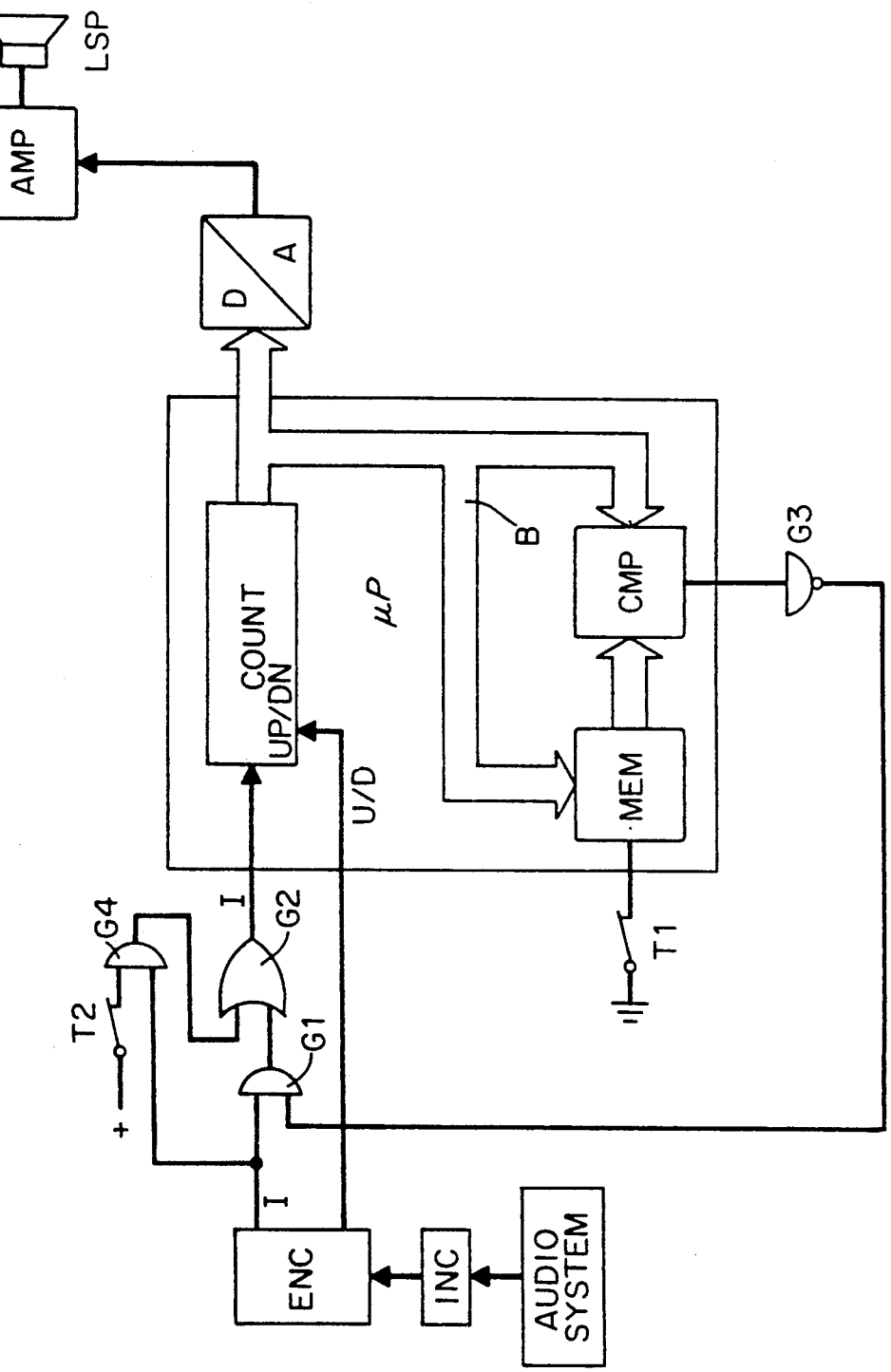
FIG. 2 is a block diagram showing the essential elements of the invention and clarifying the operation thereof.

FIG. 2 illustrates the procedures just described in the form of a flow chart.

It will initially be assumed that the established volume is at a minimum. An incremental generator INC in the form of a knob is rotated, releasing pulses I that are processed in an encoder, which emits them while triggering a binary counter COUNT up or down by way of a line U/D (up/down). Pulses I arrive by way of an AND gate G1 and an OR gate G2 at the counting input terminal of counter COUNT. AND gate G1 is initially open to the H level from a gate G3. Once a prescribed level of volume, a particular counter state, that is, that corresponds to the desired threshold has been attained, it can be stored in a memory MEM by activating a button T1. The signal emitted by the counter is forwarded by a bus line B to a digital-to-analog converter D/A, the analog-output voltage of which is utilized to control an amplifier AMP. A loudspeaker LSP is connected to the amplifier.

During subsequent adjustments of the volume, the digital signal emitted by the counter is constantly compared with the stored level by a comparator CMP. An H level is emitted in the event of identity and is negated by gate G3, blocking AND gate G1, so that no further pulses I from the encoder will be allowed through. The counter state will accordingly remain steady and cannot be increased, even when the incremental generator is activated.

If this level is nevertheless to be exceeded, which should only be done by an authorized person, another, not directly accessible, code button T2 can be activated, opening a gate G4, which allows pulses I through to the counting input terminal of the counter.

What is claimed is:

1. An arrangement for adjusting volume of a played-beck signal from an audio system, comprising: a pulse generator; encoder means connected to said pulse generator for processing pulses from said generator; counting means triggered by pulses from said encoder means for setting said counting means to count up or down; said counting means having a counting input; gate means connected to said counting input and an output of said encoder means; memory means connected to an output of said counting means for storing a predetermined counter state corresponding to a predetermined threshold; first switch means for actuating said memory means to store said counter state when the volume of said played-back signal corresponding to said threshold has been attained; audio receiver means for receiving said output from said counting means; comparator means connected to said output of said counting means and output of said memory means for comparing constantly the output of said counting means with the threshold stored in said memory means; said gate means responding to a control signal from said comparator means for blocking an output signal from said output of said encoder means to said counting means when said output signal of said counting means is substantially equal to the threshold stored in said memory means, so that the counter state remains constant upon further actuation of said pulse generator; and second switch means connected to said gate means for opening said gate means to remove said blocking and transmit the output signal from said encoder to said counting means for exceeding the volume represented by said threshold.

2. An arrangement as defined in claim 1, wherein said audio receiver means comprises an amplifier with output connected to a loudspeaker.

3. An arrangement as defined in claim 2, including a digital-to-analog converter connected between said output of said counting means and an input of said amplifier.

4. An arrangement as defined in claim 1, wherein said gate means comprises a first AND gate with an input connected to the output of said encoder means; an OR gate having an input connected to an output of said first AND gate; a second AND gate having an input connected to said input of said first AND gate and to the output of said encoder means; said second AND gate having an output connected to another input of said OR gate, said OR gate having an output connected to said counting input of said counting means; an additional gate connected to said comparator means and another input of said first AND gate for supplying said control signal from said comparator means; said second switch means being connected to another input of said second AND gate.

* * * * *